United States Patent
Bugyi et al.

(10) Patent No.: US 9,637,814 B2
(45) Date of Patent: May 2, 2017

(54) HIGH-RATE REACTIVE SPUTTERING OF DIELECTRIC STOICHIOMETRIC FILMS

(71) Applicants: University of West Bohemia in Pilsen, Pilsen (CZ); TRUMPF Huettinger Sp. z o. o., Zielonka (PL)

(72) Inventors: Rafal Bugyi, Warsaw (PL); Jaroslav Vlcek, Plzen (PL); Jiri Rezek, Plzen (PL); Jan Lazar, Malenice (PL)

(73) Assignees: University of West Bohemia in Pilsen, Pilsen (CZ); TRUMPF Huettinger Sp. z o. o., Zielonka (PL)

( * ) Notice: Subject to any disclaimer, the term of this patent is extended or adjusted under 35 U.S.C. 154(b) by 0 days.

(21) Appl. No.: 14/831,059

(22) Filed: Aug. 20, 2015

(65) Prior Publication Data

US 2015/0354052 A1    Dec. 10, 2015

Related U.S. Application Data

(63) Continuation of application No. PCT/EP2014/051233, filed on Jan. 22, 2014.

(30) Foreign Application Priority Data

Feb. 20, 2013   (EP) .................................... 13155936

(51) Int. Cl.
*C23C 14/08* (2006.01)
*H01J 37/34* (2006.01)
(Continued)

(52) U.S. Cl.
CPC ...... *C23C 14/0042* (2013.01); *C23C 14/0094* (2013.01); *C23C 14/08* (2013.01); *C23C 14/548* (2013.01); *H01J 37/3467* (2013.01)

(58) Field of Classification Search
CPC . C23C 14/0042; C23C 14/0094; C23C 14/08; C23C 14/548; H01J 37/3467
(Continued)

(56) References Cited

U.S. PATENT DOCUMENTS 5,292,417 A * 3/1994 Kugler ................ C23C 14/0042
                                                         204/192.12
2009/0173622 A1   7/2009 Weichart et al.
2012/0031749 A1   2/2012 Dubs et al.

FOREIGN PATENT DOCUMENTS

EP         1553206 A1    7/2005
WO    WO2007147582 A1   12/2007
(Continued)

OTHER PUBLICATIONS

Lazar et al., "Ion flux characteristics and efficiency of the deposition processes in high power impulse magnetron sputtering of ziconium", Journal of Applied Physics, 108, 063307, 2010, 9 pages.
(Continued)

*Primary Examiner* — Rodney McDonald
(74) *Attorney, Agent, or Firm* — Fish & Richardson P.C.

(57) ABSTRACT

A method of controlling a reactive sputter deposition process includes selecting a control process parameter for a target material and a reactive gas, the target material included in a target acting as a cathode, the reactive sputter deposition process involving forming a compound from a reaction between the target material and reactive gas species associated with the reactive gas in a vacuum chamber; establishing an operation regime for the reactive sputter deposition process for a given target power; and performing, based on the selected control process parameter and the established operation regime, the reactive sputter deposition process in a transition region between a metallic mode and a covered mode through a controlled pulsed reactive gas flow rate into the vacuum chamber, such that a stabilized reactive depo-
(Continued)

sition of the compound on a substrate is achieved, the deposited compound on the substrate comprising a dielectric stoichiometric film.

20 Claims, 5 Drawing Sheets

(51) Int. Cl.
*C23C 14/00* (2006.01)
*C23C 14/54* (2006.01)

(58) Field of Classification Search
USPC .................................. 204/298.03, 192.13
See application file for complete search history.

(56) References Cited

FOREIGN PATENT DOCUMENTS

WO     WO2009071667 A1    6/2009
WO     WO2010125002 A1    11/2010

OTHER PUBLICATIONS

Martin et al., "High rate and process control of reactive sputtering by gas pulsing: the Ti-O system", Thin Solid Films, 377-378, 2000, pp. 550-556.
International Search Report from corresponding PCT Application No. PCT/EP2014/051233, mailed Feb. 21, 2014, 3 pages.
Notification Concerning Transmittal of International Preliminary Report on Patentability and Written Opinion of the International Searching Authority for corresponding PCT Application No. PCT/EP2014/051233, mailed Sep. 3, 2015, 7 pages.

* cited by examiner

HIGH-RATE REACTIVE SPUTTERING OF DIELECTRIC STOICHIOMETRIC FILMS

CROSS-REFERENCE TO RELATED APPLICATIONS

This application is a continuation of and claims priority under 35 U.S.C. §120 to PCT Application No. PCT/EP2014/051233 filed on Jan. 22, 2014, which claimed priority to European Application No. EP 13 155 936.1, filed on Feb. 20, 2013. The contents of both of these priority applications are hereby incorporated by reference in their entirety.

TECHNICAL FIELD

This disclosure relates to methods, systems, and apparatus for reactive sputtering, particularly for establishing high-rate depositions of dielectric stoichiometric films with minimized arcing.

BACKGROUND

Dielectric films (particularly oxides and nitrides) are widely used in a broad range of applications such as semiconductor chips, magnetic and optical recording, flat panel displays, ink jet printer heads, solar cells, integrated optics, optical films, and hard protective films. Reactive magnetron sputtering which involves sputtering a metal target in argon-oxygen or argon-nitrogen gas mixtures is a commonly used deposition method to produce these films. However, control of such a reactive sputtering process to both maximize the rate of deposition or film formation and to achieve a proper film stoichiometry has been difficult to accomplish.

Reactive sputtering is a very versatile coating technique that allows the preparation of a wide variety of compound materials. However, it has traditionally had one major drawback. When the partial pressure of the reactive gas (e.g., oxygen or nitrogen) reaches the right level to form a stoichiometric film of the metal compound (e.g., oxide or nitride) on the surface of a substrate, it also forms the same metal compound on the surface of the metal target. This, in turn, results in a substantially reduced deposition rate of the films due to low sputtering yield of the metal atoms from the compound part of the metal target. In addition, considerable arcing, leading to a low quality of the deposited films, can be observed on the target under these conditions at high target power densities applied (e.g., during high power impulse magnetron sputtering). Arcing indicates the generation of short circuits between the target (cathode) and an anode or electric ground of vacuum system, caused by the build-up of insulating films on the target. There are two "modes" of operation for reactive sputtering of a metal target to deposit a compound film. For a low flow rate of the reactive gas into the vacuum chamber, the target remains metallic. For a high flow rate of the reactive gas, the target is covered by the compound. Much higher (usually 5 to 10 times) deposition rates are achieved in the "metallic mode" than in the "covered (poisoned) mode".

A recent development of the well-established magnetron sputtering technique is the high power impulse magnetron sputtering (HiPIMS) which is characterized by target power densities applied during short voltage pulses. The high target power density leads to the generation of very dense discharge plasmas with high degrees of ionization of sputtered atoms. Consequently, film deposition can be carried out at highly ionized fluxes of the target material atoms. This is of significant interest for directional deposition into high aspect ratio trench and via structures, for substrate-coating interface engineering and ion-assisted growth of films. In spite of several successful applications of these systems to reactive sputter depositions of dielectric films, there are still substantial problems with arcing during the deposition processes at high target power densities and with low deposition rates achieved.

Accordingly, there is a need in the art of HiPIMS for a method and apparatus providing effective and reliable control of the reactive sputtering process to achieve high-rate deposition of dielectric stoichiometric films with minimized arcing.

SUMMARY

The present invention overcomes the above mentioned problems, even when high power impulse magnetron sputtering a metal target is used, by providing a reactive sputtering processing system and method that controls a pulsed reactive gas flow rate into a vacuum chamber at a constant target voltage, kept by a power supply, to promote a high-rate deposition of dielectric stoichiometric films in a transition region between a metallic mode and a covered (poisoned) mode.

As the reactive gas flow rate is varied, there is a transition between the metallic mode and the covered mode exhibiting hysteresis; i.e., the difference in the deposition rate (and the target voltage) depending on whether a specific sputtering state is entered from the metallic mode or from the covered mode under otherwise identical process conditions. To form high-quality dielectric stoichiometric films at a high rate, reactive sputtering can be operated in the transition region between the metallic mode and the covered mode.

One aspect of the invention features a method of controlling a reactive sputter deposition process. The method includes selecting a control process parameter for a target material and a reactive gas, the target material included in a target acting as a cathode, the reactive sputter deposition process involving forming a compound from a reaction between the target material and reactive gas species associated with the reactive gas in a vacuum chamber; establishing an operation regime for the reactive sputter deposition process for a given target power; and performing, based on the selected control process parameter and the established operation regime, the reactive sputter deposition process in a transition region between a metallic mode and a covered mode through a controlled pulsed reactive gas flow rate into the vacuum chamber, such that a stabilized reactive deposition of the compound on a substrate is achieved, the deposited compound on the substrate comprising a dielectric stoichiometric film.

The method makes it possible to utilize benefits of the HiPIMS discharges with target power densities of up to several kWcm-2 during short target voltage pulses (typically 40 μs to 200 μs) in high-rate depositions of dielectric stoichiometric films.

The transition region between a metallic mode and a covered mode may be determined based on a range of the reactive gas partial pressure in the vacuum chamber defined using a critical value of the control process parameter. In some implementations, for a given target material and reactive process gas, one of the two process parameters (namely, the target current, alternatively the average target current in a period of a pulsed power supply, or the reactive gas partial pressure in the vacuum chamber), which are simultaneously monitored in time by a process controller, is selected as a control process parameter. For a given nominal target power, and the target material and the reactive process gas, an optimized constant target voltage, non-reactive gas (argon) partial pressure, total reactive gas flow rate into the vacuum chamber and configuration of the reactive gas conduit system, together with a critical value of the control process parameter selected, are determined empirically using the apparatus controlling the reactive sputtering process on the basis of the sensed time-dependent values of the control parameter. This determination is based on measurements of the deposition rates and characterization of the films deposited. The critical value of the control parameter defines a range of the reactive gas partial pressure in the chamber through the controlled pulsed reactive gas flow rate into the chamber allowing to perform a stabilized high-rate reactive magnetron deposition of dielectric stoichiometric films in a transition region between a metallic mode and a covered (poisoned) mode.

The target may be a metal and a compound formed from the reaction may be a dielectric stoichiometric material. The sputter deposition of a compound onto a substrate may be performed at a rate at least about 40% of a rate of deposition of the target material in a metallic mode corresponding to operating without the presence of said reactive gas at substantially the same power conditions.

The compound may be selected from the group comprising oxides, nitrides, oxynitrides, carbides, sulfides, fluorides, chlorides, borides, and mixtures thereof. The control process parameter may be the target current in case of continuous DC sputtering, or the average target current in a period of a pulsed power supply in case of pulsed sputtering, or the reactive gas partial pressure in a vacuum chamber.

The sensitivity of the target current in case of continuous DC sputtering, or of the average target current in a period of a pulsed power supply in case of pulsed sputtering, and of the reactive gas partial pressure in a vacuum chamber to constant flow rate pulses of the reactive gas into the vacuum chamber at a constant target voltage under the same discharge conditions is determined. In other words, process characterization is carried out and it is determined how the parameters mentioned above respond to constant flow rate pulses of the reactive gas into the vacuum chamber at a constant target voltage under the same discharge conditions. The parameter showing the highest sensitivity to constant flow rate pulses of the reactive gas into the vacuum chamber at a constant target voltage under the same discharge conditions may be selected as control process parameter.

The operation regime may be established based on determining an (optimized) constant target voltage, non-reactive gas (e.g., argon), partial pressure, total reactive gas flow rate into the vacuum chamber and configuration of the reactive gas conduit system, together with a critical value of the control process parameter selected, such that a given deposition rate and desired physical properties of films formed are achieved at arcing below a given level.

This results in high deposition rates and desired elemental compositions and physical properties of films formed at a minimized arcing. The determination of the above quantities is based on fundamental knowledge in the art of reactive magnetron sputtering, on measurements of the deposition rates, on characterization of the films deposited and on detection of discharge instabilities (arcs).

The critical value of the control process parameter may be used to define the times of terminations and successive initiations of preset constant reactive gas flow rate pulses into the vacuum chamber. The target power may be supplied at a constant target voltage using a DC power supply or at a constant target voltage during discharge pulses using a pulsed power supply, including a high power pulsed DC power supply with target power densities of up to several kWcm$^{-2}$ in short target voltage pulses.

Another aspect of the invention features a reactive sputter deposition apparatus, comprising: a vacuum chamber; an anode; a reactive gas source that provides a reactive gas into the vacuum chamber, the reactive gas characterized by a given pulsed flow rate into the chamber, maintained by mass flow controllers, or by a given partial pressure in the chamber, determined from a total gas pressure in the chamber measured at a fixed preset value of the non-reactive gas partial pressure; a target as a cathode in the vacuum chamber and including a material to be combined with reactive gas species to form a compound; a power supply electrically coupled to said target such that said target may be selectively powered by the power supply to generate a discharge plasma in the chamber with the reactive gas species that combine with the material of the target to form the compound; a control device that senses time-dependent values of said control process parameter and provides a signal to said mass flow controllers to adjust a pulsed reactive gas flow rate into the vacuum chamber at a constant value of the non-reactive gas partial pressure to perform a stabilized reactive deposition of dielectric stoichiometric films at high rates and a minimized arcing in a transition region between a metallic mode and covered mode.

The target may be a metal and the compound may be a dielectric stoichiometric material. The control device may be configured to allow simultaneously monitoring in time both the reactive gas partial pressure in said vacuum chamber, and either the target current in case of continuous DC sputtering or the average target current in a period of a pulsed power supply in case of pulsed sputtering to select one of them as said control process parameter for a given target material and reactive process gas on the basis of a higher sensitivity of one of these quantities to constant flow rate pulses of said reactive gas into said vacuum chamber at a constant target voltage under the same discharge conditions.

The power supply may be a DC power supply operating at a constant target voltage or a pulsed power supply operating at a constant target voltage during discharge pulses, including a high power pulsed DC power supply with target power densities of up to several kWcm$^{-2}$ in short target voltage pulses, the pulsed power supplies possessing an internal or external computer control allowing to evaluate a time-dependent average target current in a period of the pulsed power supply during the reactive gas flow rate pulsing.

The invention may take physical form in certain parts and arrangement of parts, embodiments of which will be described in detail in this specification and illustrated in the accompanying drawings which form a part hereof.

DETAILED DESCRIPTION

The method and associated apparatus of the present invention are designed to control and preferably optimize the conditions for interaction between target material atoms and reactive gas atoms and molecules on the target surface, on the surface of growing films and in the discharge plasma during reactive high power magnetron sputtering (particularly HiPIMS) a metal target such that high quality dielectric stoichiometric films may be deposited at high deposition rates.

Figure 1:
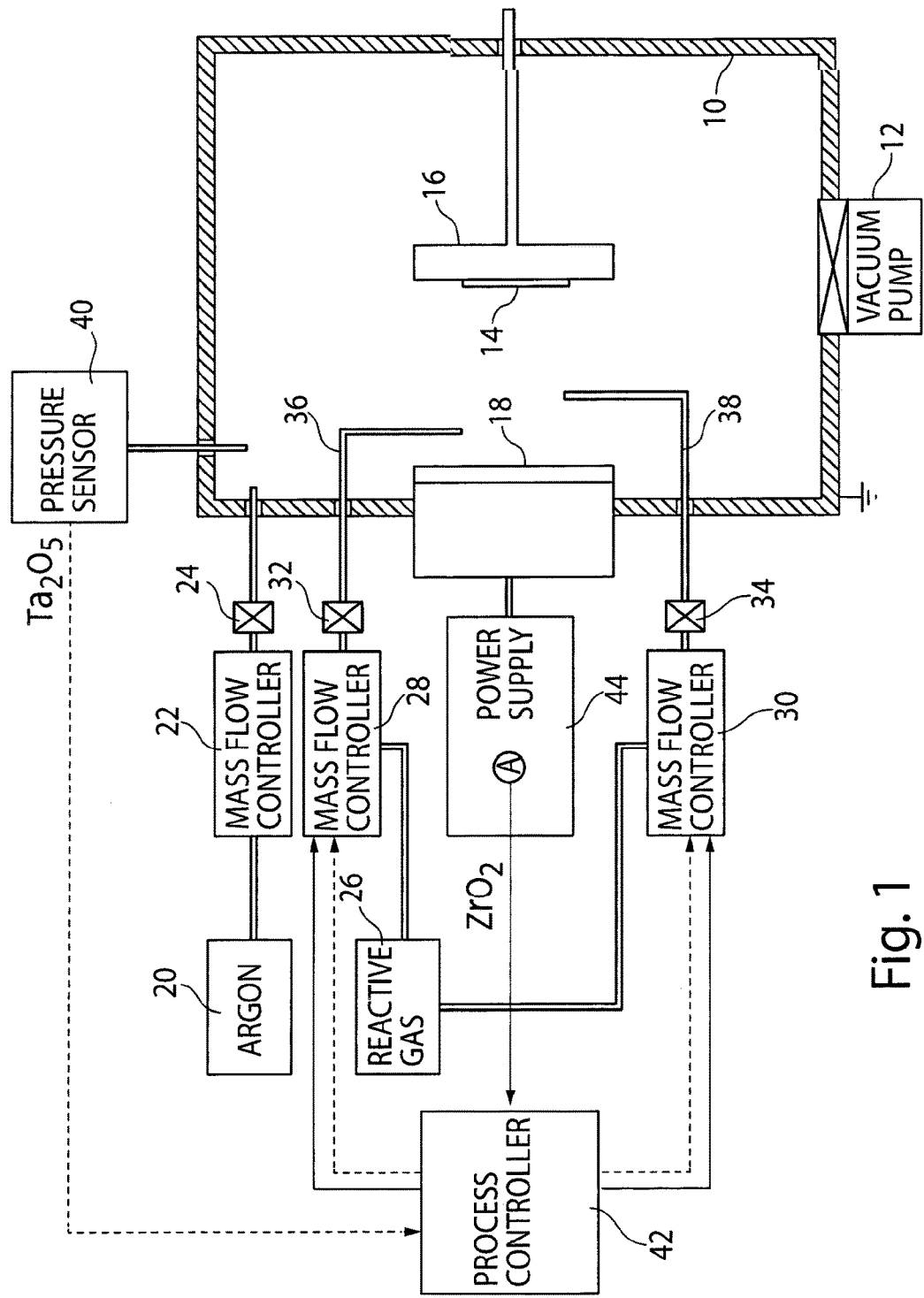
FIG. 1 shows a schematic diagram of component parts of an example sputtering system.

Referring to FIG. 1, there are schematically depicted component parts of a sputtering system. A vacuum chamber 10 is evacuated by a pump 12 after a substrate material 14 (e.g., silicon wafer, glass, steel, etc.) is mounted on a holder 16 within the chamber 10. A target material 18 (e.g., zirconium, tantalum or some other metal) is also mounted within the chamber 10. The target 18 serves as a cathode in the process, and the inside walls of chamber 10 serve as anode. Preferably, the cathode is a part of the magnetron sputter source (a detailed structure not shown).

A non-reactive gas (e.g., inert gas like argon) is admitted to chamber 10 from a source 20 via a mass flow controller 22, shut-off valve 24, and conduit. A reactive gas (e.g., oxygen, nitrogen, methane, acetylene, etc.) is provided from a source 26 through mass flow controllers 28 and 30, shut-off valves 32 and 34, and via conduits 36 and 38 located generally at two different positions in front of the sputtered target to reduce the target coverage by a compound particularly during a high power magnetron sputtering process, when the degree of dissociation of the reactive gas molecules is significantly increased not only in the flux onto the substrate but also in the flux onto the target. In an alternative embodiment, the reactive gas source 26 may be replaced by two sources of different reactive gases (e.g., oxygen and nitrogen) to reactively sputter deposit ternary compounds (e.g., oxynitrides or mixtures of oxide and nitride material phases). A pressure sensor 40 measures the total pressure in the vacuum chamber at a fixed preset value of the argon partial pressure, kept by mass flow controller 22. A process controller 42 (preferably a programmable logical controller) provides a control signal to the mass flow controllers 28 and 30 on the basis of sensed time-dependent values of either the target current (alternatively, the average target current in a period, which may be evaluated by a computer controlling the operation of a pulsed power supply 44 used), e.g., for sputter deposition of $ZrO_2$ films, or the total pressure in vacuum chamber determined by the pressure sensor 40 (e.g., for sputter deposition of $Ta_2O_5$ films), as will be further explained below.

The power supply 44 provides power to target 18 (e.g., by an electrically conductive connection of a cathode terminal conductor to the target, the target thus acting as part of the cathode when so connected). In a preferred embodiment of the present invention, a high power pulsed DC power supply 44 with arc handling capabilities (a fast arc detection and suppression technique) provides short (typically 40 µs to 200 µs) negative constant-voltage pulses at the target with target power densities on the order of $kWcm^{-2}$ and a typical duty cycle (ratio of the voltage pulse duration to the period duration) in the range from 2% to 10%. Alternative implementations of the present invention may employ various continuous DC, pulsed or RF power supplies as the power supply 44, such target power supply techniques being generally known in the art.

Accordingly, in a reactive sputtering process, reactive and non-reactive gases flow into the chamber, and power supplied to the cathode provides an electric potential between the cathode and the anode, thus generating a discharge plasma in the chamber. The plasma includes non-reactive gas atoms and ions, reactive gas atoms, molecules and ions, and sputtered target material atoms and ions, particularly at high target power densities. A source of metal atoms for deposition on substrate is their sputtering from the target due to its ion bombarding. The main source of reactive gas for deposition on the substrate is its flow into the vacuum chamber, which is related to the reactive gas partial pressure. In addition, reactive gas species can react with the target material at the target surface to form a compound on the target (e.g., oxidize the target). Such compound formation on the target is well recognized as a primary problem in reactive sputtering, and is particularly a problem in reactive sputtering of metal targets to produce dielectric stoichiometric films at high deposition rates.

In accordance with the present invention, process controller 42 provides a control signal to the mass flow controllers 28 and 30 to adjust the pulsed reactive gas flow rate into the chamber (by a duration of preset constant gas flow rate pulses) such that the reactive gas flow rate, which is related to the reactive gas partial pressure in the chamber, is maintained within a certain specified range. This range of the reactive gas flow rate into the chamber (and the reactive gas partial pressure in the chamber) is determined based on a process development procedure as follows.

First, for a given target material and reactive process gas (or gases), one of the two process parameters (namely, the target current, alternatively the average target current in a period of a pulsed power supply, or the total pressure in the chamber at a fixed preset value of the argon partial pressure, i.e., the reactive gas partial pressure in the chamber), which are simultaneously monitored in time by process controller 42, is selected as a control process parameter on the basis of a higher sensitivity of one of these quantities to constant flow rate pulses of the reactive gas into the vacuum chamber at a constant target voltage (alternatively, a constant target voltage during discharge pulses) under the same discharge conditions. A different behavior of various target materials is mainly caused by their different affinities for chemical reactions with reactive gases on target surfaces and by different, or even opposite, dependences of the secondary electron emission coefficients for partly covered targets (e.g., by oxides or nitrides) on the target coverage.

Figure 2A:
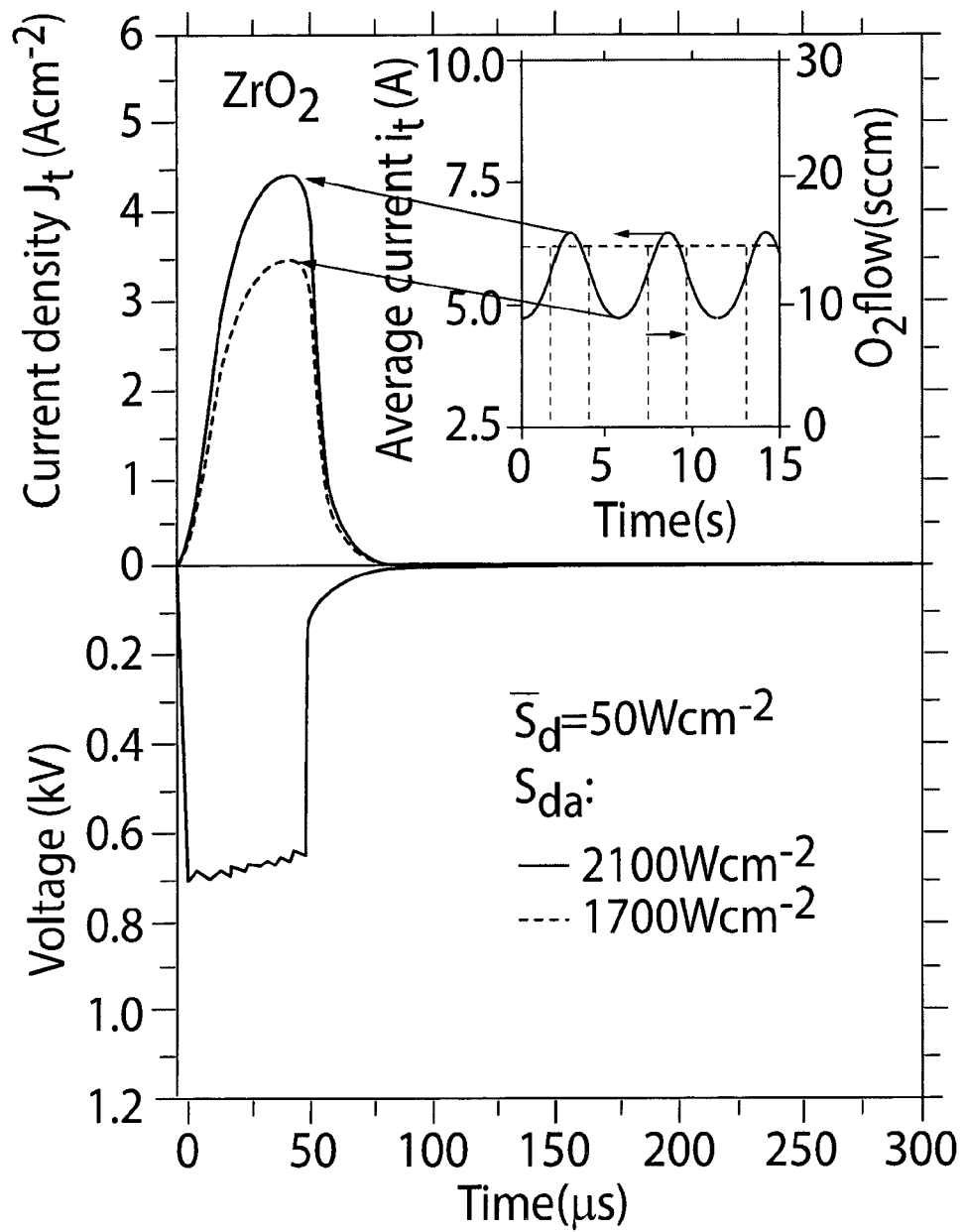
FIGS. 2A and 2B show example waveforms of a target voltage and a target current density for a fixed average target power density of 50 Wcm$^{-2}$ in a period and a voltage pulse duration of 50 μs during a controlled reactive HiPIMS of $ZrO_2$ and $Ta_2O_5$ films, respectively.
Figure 2B:
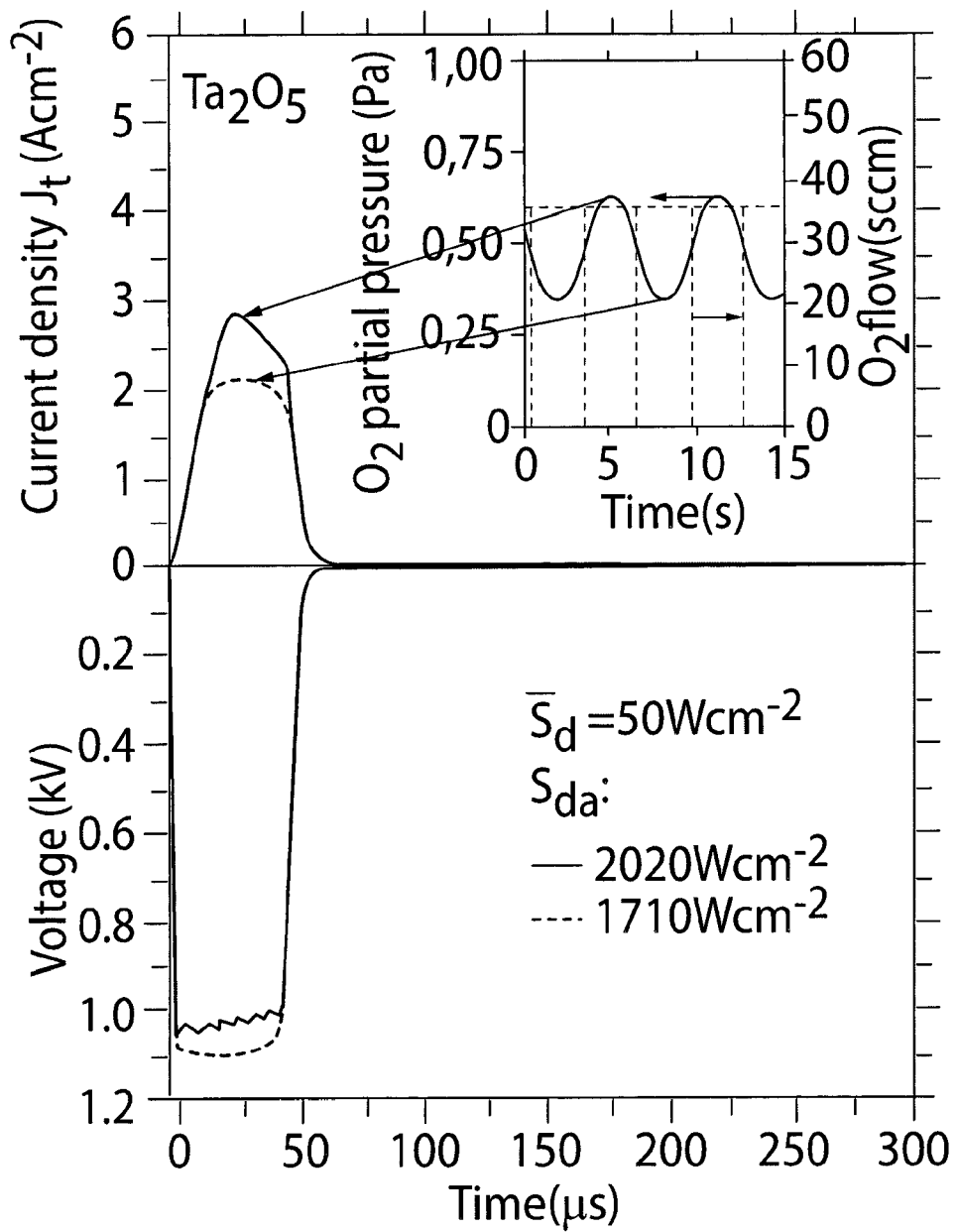

Second, for a given nominal target power, and the target material and the reactive process gas, an optimized constant target voltage, non-reactive gas (argon) partial pressure, total reactive gas flow rate in both conduits 36 and 38 and its dividing into them, as well as the locations of the conduits in front of the target and directions of the reactive gas flow from them (e.g., towards the target or substrate), together with a critical value of the control process parameter selected (the average target current in a period for sputter deposition of $ZrO_2$ films and the oxygen partial pressure for sputter deposition of $Ta_2O_5$ films in FIGS. 2A and 2B, respectively), are determined using the apparatus controlling the reactive sputtering process on the basis of the sensed time-dependent values of the control parameter. This determination is based on fundamental knowledge in the art of reactive magnetron sputtering and on measurements of the deposition rates and characterization of the films deposited (particularly optical transparence, elemental composition, hardness, mass density, structure and surface morphology). The critical value of the control parameter defines a range of the reactive gas partial pressure in the chamber allowing to perform a stabilized high-rate reactive magnetron deposition of dielectric stoichiometric films in a transition region between a metallic mode and a covered (poisoned) mode. When a value of the monitored control parameter becomes to be higher than the corresponding critical value, the process controller 42 provides a signal to the mass flow controllers 28 and 30 to switch off the reactive gas flow into the vacuum chamber, and thus to minimize arcing on a compound part of the metal target and to avoid a substantial reduction in the deposition rate of films. After a continuing increase in the control parameter, mainly due the "inertia" associated with changes in the reactive gas partial pressure in the chamber, the values of the control parameter decrease (as shown in FIGS. 2A and 2B). When an instantaneous value of the control parameter becomes to be equal to or less than its critical value, the process controller 42 provides a signal to the mass flow controllers 28 and 30 to switch on the reactive gas flow into the vacuum chamber, and thus to achieve a sufficient incorporation of the reactive gas atoms into the films (stoichiometric composition). This procedure of establishing the operation regime for a stabilized reactive deposition of dielectric stoichiometric films at high rates may be repeated for various nominal powers.

In addition to various alternative implementations of the present invention with the use of standard "low power" continuous DC, pulsed or RF power supplies with a usual target power density less than 20 $Wcm^{-2}$ as the power supply 44, it is particularly useful for high-rate deposition of dielectric stoichiometric compounds using high power magnetron sputtering a metal target, including high power impulse magnetron sputtering (HiPIMS) with target power densities of up to several $kWcm^{-2}$ in short target voltage pulses (typically 40 µs to 200 µs). Application of the pulsed reactive gas flow control according to the present invention with the use of a commercially available high power pulsed DC power supply possessing the following features, (i) production of negative voltage pulses at an essentially constant value (the so-called constant-voltage mode of operation), (ii) effective arc handling capabilities (a fast arc detection and suppression technique), and (iii) a computer control able to evaluate the time-dependent average target current in a period of the pulsed power supply during the reactive gas flow rate pulsing (as shown in FIG. 2A), makes it possible to utilize benefits of the HiPIMS discharges. These are very high total ion fluxes to the target during voltage pulses leading to intense sputtering of metal atoms from a metallic fraction at the target and of reactive gas atoms from a compound fraction at the target, reducing the target coverage by the compound, and thus increasing the deposition rate of films. In addition, the fluxes of the reactive gas atoms and molecules to the target during the voltage pulses are substantially reduced by a strong "sputtering wind" of the sputtered atoms resulting in a rarefaction of the gas mixture in front of the target. High degrees of dissociation of the reactive gas molecules in the flux onto the substrate lead to a higher deposition rate of films and to a higher incorporation of the reactive gas atoms into the films due to a much higher sticking coefficient of the reactive gas atoms at the substrate surface compared to the reactive gas molecules. Moreover, much higher total ion fluxes to the substrate result in subplantation of the reactive gas atoms into the growing films and in their densification.

Process controller 42 may be implemented in various ways. In some examples, process controller 42 includes a programmable logical controller or a programmed digital computer (e.g., personal computer or workstation) with data acquisition and control interfaces. It may be understood to incorporate the process controller 42 into the power supply 44 itself.

The following example of experimental results obtained in developing and implementing reactive sputter deposition processes for $ZrO_2$ and $Ta_2O_5$ films in accordance with the hereinabove described embodiments is merely provided by way of example to illustrate features and characteristics of the present invention, which is not to be construed as being limited thereby.

Example

The experiments were performed using a strongly unbalanced magnetron source with a directly water-cooled planar zirconium or tantalum target (99.9% Zr and Ta purity, diameter of 100 mm and thickness of 6 mm) in a standard stainless-steel vacuum chamber (a diameter of 507 mm and a length of 520 mm), which was evacuated by a diffusion pump (2 $m^3$ $s^{-1}$) backed up with a rotary pump (30 $m^3$ $h^{-1}$). The base pressure before deposition was $10^{-3}$ Pa. The total pressure of the argon-oxygen gas mixture was around 2 Pa.

The magnetron was driven by a high power pulsed DC power supply (HMP 2/1, Hüttinger Elektronik). The repetition frequency was 500 Hz and the voltage pulse duration ranged from 50 µs to 200 µs with the corresponding duty cycle from 2.5% to 10%. The $ZrO_2$ and $Ta_2O_5$ films were deposited on silicon substrates at a floating potential. The target-to-substrate distance was 100 mm. The film thickness (typically between 800 nm and 1200 nm) was measured by profilometry (Dektak 8 Stylus Profiler, Veeco). The substrate temperatures were less than 300° C. during depositions. The elemental composition of the films was measured by a PANalytical wavelength-dispersive X-ray fluorescence spectrometer MagiX PRO with a calibration performed by Rutherford backscattering spectrometry. Structure of the films was investigated using a PANalytical X'Pert PRO diffractometer. The refractive index and extinction coefficient were determined by variable angle spectroscopic ellipsometry using the J. A. Woollam Co. Inc. instrument. Film hardness was determined using a computer-controlled microhardness tester (Fischerscope H-100B) with a preset maximum load of 20 mN.

FIGS. 2A and 2B show time evolutions of the target voltage and the target current density for a preset average target power density of 50 $Wcm^{-2}$ in a period and voltage pulse duration of 50 µs, together with the corresponding time evolutions of the average target current in a period (at a preset argon partial pressure of 2 Pa) and the oxygen partial pressure (at a preset argon partial pressure of 1.5 Pa) controlling the oxygen flow rate pulses during reactive sputter depositions of highly transparent, stoichiometric $ZrO_2$ and $Ta_2O_5$ films, respectively. Note that the shown values of the oxygen flow rate represent the total oxygen flow rates in conduits 36 and 38 located 20 mm and 40 mm from the target, respectively, during the deposition of the $ZrO_2$ films, and 20 mm from the target during the deposition of the $Ta_2O_5$ films (FIG. 1). The ratios between the oxygen flow rates in the conduits 36 and 38 were 5:2 with the flows directed to the substrate for the deposition of the $ZrO_2$ films and 1:1 with the flows directed to the target for the deposition of the $Ta_2O_5$ films. As can be seen in FIGS. 2A and 2B, the average target power density in a pulse ranges from 1.70 kWcm$^{-2}$ to 2.10 kWcm$^{-2}$, and from 1.71 kWcm$^{-2}$ to 2.02 kWcm$^{-2}$ for the controlled depositions of the ZrO$_2$ and Ta$_2$O$_5$ films, respectively, between the corresponding minimum and maximum oxygen partial pressures allowed by the process controller 42.

Figure 3A:
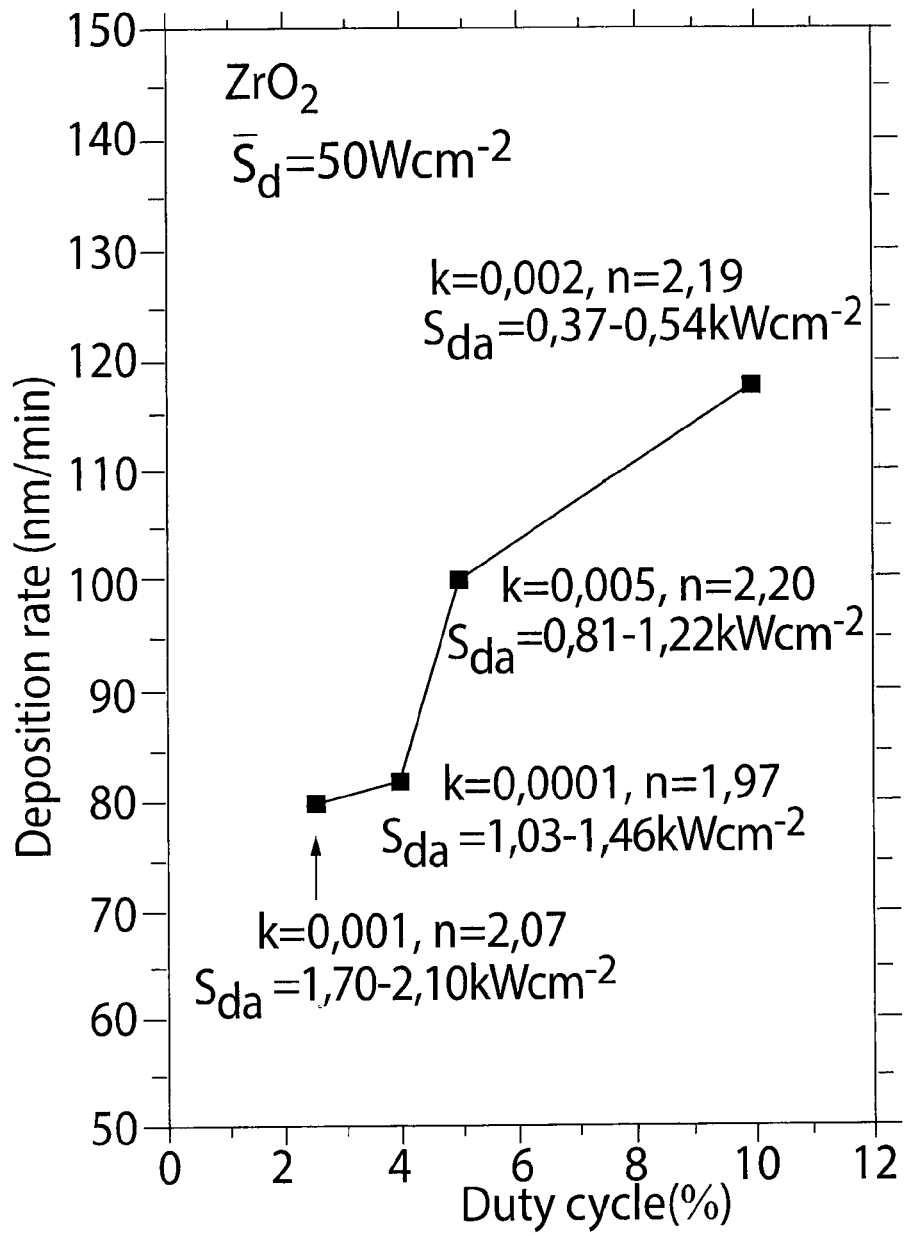
FIGS. 3A and 3B show an example deposition rate as a function of a duty cycle, together with the corresponding extinction coefficient and refractive index of $ZrO_2$ and $Ta_2O_5$ films, respectively, for a fixed average target power density of 50 $Wcm^2$ in a period.
Figure 3B:
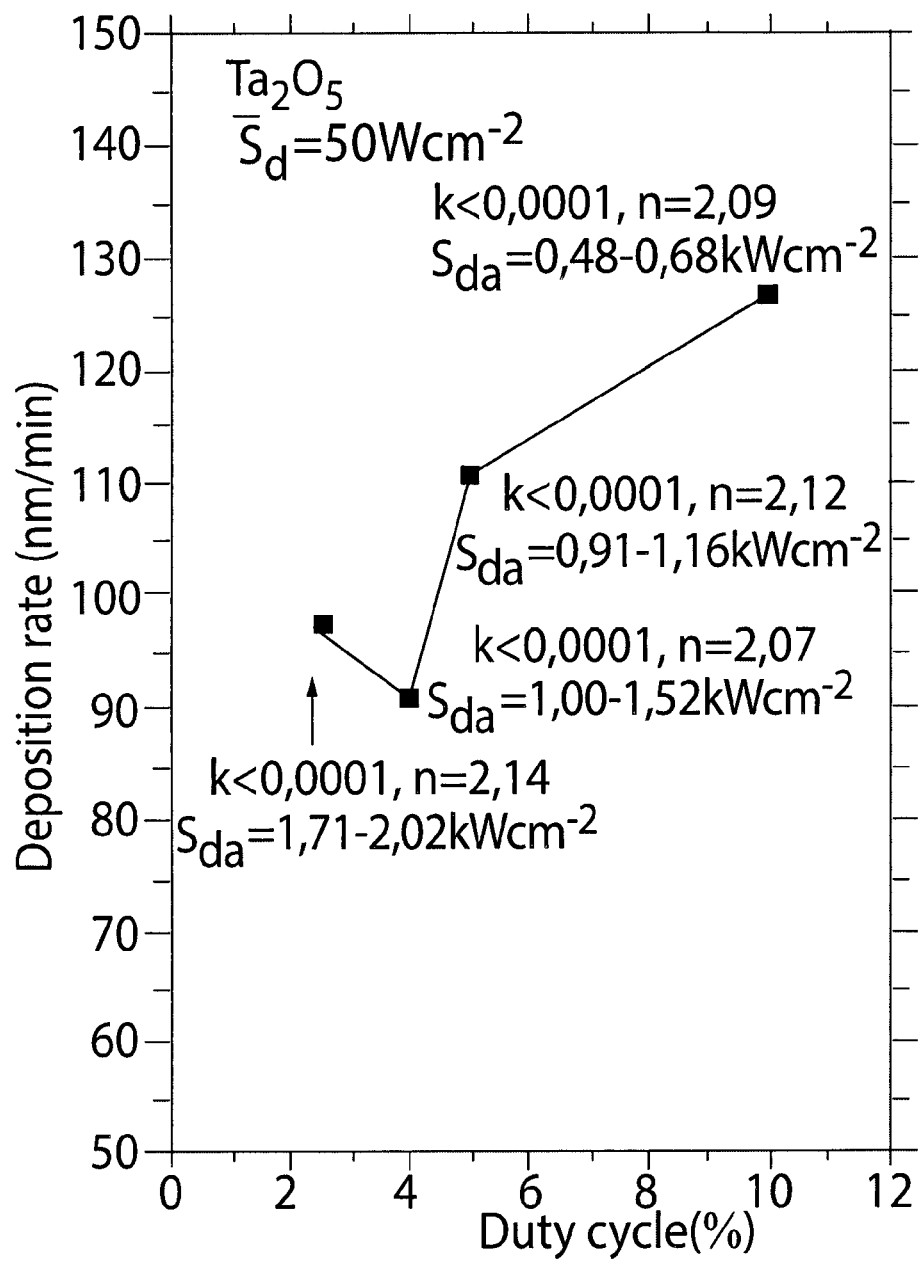

FIGS. 3A and 3B show the deposition rates of films and the average target power densities in a pulse, together with the extinction coefficients, k, and the refractive indexes, n, of the films measured at 550 nm, for a fixed average target power density of 50 Wcm$^{-2}$ in a period and various voltage pulse durations in the range from 50 µs to 200 µs during depositions with the corresponding duty cycles from 2.5% to 10%. The fixed argon partial pressure was 2 Pa for all the depositions of the ZrO$_2$ films, while it ranged from 1.5 Pa for the 50 µs voltage pulses to 1 Pa for the 200 µs voltage pulses at the depositions of the Ta$_2$O$_5$ films. As can be seen, very high deposition rates have been achieved for both the stoichiometric ZrO$_2$ and Ta$_2$O$_5$ films. They are highly optically transparent and densified (mass density of up to 95% of that for the respective bulk material). The ZrO$_2$ films are crystalline (a monoclinic phase), while the Ta$_2$O$_5$ films are nanocrystalline (as expected at the substrate temperature less than 300° C.). Their hardness ranges from 10 GPa to 16 GPa, and from 7 GPa to 8 GPa, respectively.

Although the above description provides many specificities, these enabling details should not be construed as limiting the scope of the invention, and it will be readily understood by those persons skilled in the art that the present invention is susceptible to many modifications and equivalent implementations without departing from this scope and without diminishing its advantages. It is therefore intended that the present invention is not limited to the disclosed embodiments but should be defined in accordance with the claims which follow.

A number of embodiments of the invention have been described. Nevertheless, it will be understood that various modifications may be made without departing from the spirit and scope of the invention. Accordingly, other embodiments are within the scope of the following claims.

What is claimed is:

1. A method of controlling a reactive sputter deposition process, comprising:
   selecting a control process parameter for a target material and a reactive gas, the target material included in a target acting as a cathode, the reactive sputter deposition process involving forming a compound from a reaction between the target material and reactive gas species associated with the reactive gas in a vacuum chamber;
   establishing an operation regime for the reactive sputter deposition process for a given target power; and
   performing, based on the selected control process parameter and the established operation regime, the reactive sputter deposition process in a transition region between a metallic mode and a covered mode through a controlled pulsed reactive gas flow rate into the vacuum chamber, such that a stabilized reactive deposition of the compound on a substrate is achieved, the deposited compound on the substrate comprising a dielectric stoichiometric film.

2. The method of claim 1, wherein the target material comprises a metal, and the compound comprises a dielectric stoichiometric material.

3. The method of claim 1, wherein the reactive sputter deposition process is performed at a rate at least about 40% of a deposition rate of the target material in the metallic mode corresponding to operating without a presence of the reactive gas at a similar power condition.

4. The method of claim 1, wherein the compound is selected from a group comprising oxides, nitrides, oxynitrides, carbides, sulfides, fluorides, chlorides, borides, and mixtures thereof.

5. The method of claim 1, wherein the control process parameter comprises a particular sputtering current, and
   wherein the particular sputtering current comprises one of:
      a target current in case of continuous direct-current (DC) sputtering and
      an average target current in a period of a pulsed power supply in case of pulsed sputtering.

6. The method of claim 1, further comprising determining a first sensitivity of a particular sputtering current and a second sensitivity of a reactive gas partial pressure in the vacuum chamber to constant flow rate pulses of the reactive gas into the vacuum chamber at a constant target voltage under similar discharge conditions.

7. The method of claim 6, wherein selecting a control process parameter comprises:
   selecting one of the particular sputtering current and the reactive gas partial pressure with a higher of the first and second sensitivities as the control process parameter.

8. The method of claim 1, wherein the operation regime is established based on determining at least one of a constant target voltage, a non-reactive gas, a reactive gas partial pressure, a total reactive gas flow rate into the vacuum chamber, and a configuration of a reactive gas conduit system, together with a critical value of the selected control process parameter, such that a given deposition rate and desired physical properties of the dielectric stoichiometric film formed are achieved at arcing below a given level.

9. The method of claim 1, wherein a critical value of the control process parameter defines times of terminations and successive initiations of preset constant reactive gas flow rate pulses into the vacuum chamber.

10. The method of claim 1, wherein the given target power is supplied at one of:
    a constant target voltage using a DC power supply and a constant target voltage during discharge pulses using a pulsed power supply.

11. The method of claim 10, wherein the pulsed power supply comprises a high power pulsed DC power supply with a target power density on an order of kWcm$^{-2}$ in target voltage pulses.

12. A reactive sputter deposition apparatus, comprising:
    a vacuum chamber;
    an anode;
    a reactive gas source providing a reactive gas into the vacuum chamber;
    a target including a target material and acting as a cathode in the vacuum chamber;
    a power supply electrically coupled to the target such that the target is selectively powered by the power supply to generate a discharge plasma in the vacuum chamber with reactive gas species associated with the reactive gas that combine with the target material to form a compound; and
    a control device configured to sense time-dependent values of a control process parameter and provide a signal to at least one mass flow controller to adjust a pulsed reactive gas flow rate into the vacuum chamber at a constant value of a non-reactive gas partial pressure to perform a stabilized reactive deposition of the compound on a substrate and with a minimized arcing in a transition region between a metallic mode and covered mode, the deposited compound on the substrate comprising a dielectric stoichiometric film.

13. The reactive sputter deposition apparatus of claim 12, configured to:
maintain the pulsed reactive gas flow rate by at least one of the mass flow controller or the non-reactive gas partial pressure in the vacuum chamber, and
determine the pulsed reactive gas flow rate from a total gas pressure in the vacuum chamber measured at a fixed preset value of the non-reactive gas partial pressure.

14. The reactive sputter deposition apparatus of claim 12, wherein the target material comprises a metal, and the compound comprises a dielectric stoichiometric material.

15. The reactive sputter deposition apparatus of claim 12, wherein the control device is configured to:
simultaneously monitor in time both the reactive gas partial pressure in the vacuum chamber and a particular sputtering current to determine a first sensitivity of the reactive gas partial pressure and a second sensitivity of the particular sputtering current to constant flow rate pulses of the reactive gas into the vacuum chamber at a constant target voltage under same discharge conditions, respectively, and
select, for a given target material and reactive gas, one of the reactive gas partial pressure and the particular sputtering current with a higher sensitivity of the first and second sensitivities as the control process parameter.

16. The reactive sputter deposition apparatus of claim 15, wherein the particular sputtering current comprises one of:
a target current in case of continuous DC sputtering and
an average target current in a period of a pulsed power supply in case of pulsed sputtering.

17. The reactive sputter deposition apparatus of claim 12, wherein the power supply comprises a DC power supply operating at a constant target voltage.

18. The reactive sputter deposition apparatus of claim 12, wherein the power supply comprises a pulsed power supply operating at a constant target voltage during discharge pulses.

19. The reactive sputter deposition apparatus of claim 18, wherein the power supply comprises a high power pulsed DC power supply with a target power density on an order of $kWcm^{-2}$ in target voltage pulses, and
wherein the pulsed power supplies processing an internal or external computer control allowing to evaluate a time-dependent average target current in a period of the pulsed power supply during the reactive gas flow rate pulsing.

20. The reactive sputter deposition apparatus of claim 12, wherein the reactive deposition of the compound is performed at a rate at least about 40% of a deposition rate of the target material in the metallic mode corresponding to operating without a presence of the reactive gas at a similar power condition.

* * * * *